United States Patent
Burton

(10) Patent No.: US 6,429,792 B1
(45) Date of Patent: Aug. 6, 2002

(54) DIGITAL DISPLACEMENT ENCODING SYSTEM AND METHOD

(75) Inventor: David L. Burton, McMinnville, OR (US)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 19 days.

(21) Appl. No.: 09/184,628

(22) Filed: Nov. 2, 1998

(51) Int. Cl.⁷ .......................... H03K 17/94; H03M 11/00
(52) U.S. Cl. ............................ 341/22; 341/34; 200/5 A; 200/5 R; 200/339
(58) Field of Search ...................... 341/22, 34; 200/5 A, 200/5 R, 6 A, 329, 335, 339

(56) References Cited

U.S. PATENT DOCUMENTS

| | | | |
|---|---|---|---|
| 3,668,694 A | | 6/1972 | Purdy et al. ................. 340/365 |
| 4,007,364 A | * | 2/1977 | Ojima et al. ................. 235/152 |
| 4,212,000 A | | 7/1980 | Yamada ....................... 340/347 |
| 4,949,087 A | | 8/1990 | Miyazawa .................... 341/16 |
| 5,241,308 A | | 8/1993 | Young .......................... 341/34 |
| 5,257,024 A | | 10/1993 | West ............................ 341/16 |
| 5,349,263 A | | 9/1994 | Katayama et al. ........... 310/338 |
| 5,408,286 A | | 4/1995 | Kashiwaba ............... 354/195.1 |
| 5,744,765 A | * | 4/1998 | Yamamoto ................... 200/5 A |
| 6,067,863 A | * | 5/2000 | Favre et al. .................. 341/34 |

\* cited by examiner

Primary Examiner—Timothy Edwards, Jr.

(57) ABSTRACT

A digital displacement encoder that includes a mechanical actuator constructed and arranged to be displaced to one of a null and a plurality of activation positions in response to an externally-provided force. Also included is a conductive member constructed and arranged to be positioned to one of a plurality of intermediate positions in response to the change in position of the mechanical actuator. A contact array comprising a plurality of activation signal contacts is fixedly disposed proximate to the conductive member. Also included is a digital signal generator comprising one or more electrical circuits electrically coupled to the plurality of activation signal contacts, and one more terminals at which output signals are provided. The conductive member electrically contacts a predetermined one or more of the plurality of activation signal contacts when the mechanical actuator is in each of the plurality of positions. At each of the intermediate positions, the conductive member electrically alters the electrical circuits that include the contacted signal contacts to cause a change in output signals. Preferably, the conductive member is comprised of a conductive elastomeric material. Also, it is preferable that a biasing element be included to urge the conductive member toward its null position. The digital signal generator is a voltage pull-up circuit, although any type of circuit may be used. In one embodiment, the digital signal generator provides a plurality of output signals having a nominal state responsive to the mechanical actuator being in the null position, and a plurality of activation states each responsive to the mechanical actuator being in one of the plurality of activation positions. Preferably, the signal contacts are traces on the printed circuit board. The mechanical actuator may be a rocker button, wheel or slide, among others.

20 Claims, 4 Drawing Sheets

DIGITAL DISPLACEMENT ENCODING SYSTEM AND METHOD

BACKGROUND OF THE INVENTION

1. Field of the Invention

The present invention relates generally to displacement encoders and, more particularly, to digital encoders for use with mechanical switches.

2. Related Art

A variety of conventional displacement encoders are known that produce digital signals in response to a user-supplied mechanical action. Such devices typically are used, for example, on instrument panels to allow a user to select from a number of values available for a given user input. The user-supplied mechanical action is typically provided through a knob, wheel, button, slide, lever or other mechanical actuator. Such mechanical interfaces may be provided, for example, on an instrument to allow the user to vary the value of a setting by rotating the knob or wheel, pushing the button, or displacing the slide or lever. In some such known devices, the rate of change of the setting is responsive to the rate at which the mechanical actuators are rotated, pushed, slid, or otherwise displaced from a null or nominal position. For example, a knob may be provided on an oscilloscope or defibrillator to allow a user to adjust the magnification of a displayed waveform. Generally, the user may cause the magnification to increase slowly by rotating the knob slowly, or increase rapidly by rotating the knob rapidly.

One type of conventional digital encoder is a rotary pulse generator. Rotary pulse generators provide variable-rate zooming or scrolling by allowing the user to adjust a mechanical actuator wheel on, for example, an instrument panel. The wheel is perforated with a series of slits in one or, more commonly, two rows. Two pairs of optical emitters and receivers, one pair for each row, sense the number of optical pulses resulting from the intermittent passage of light through the slits as the wheel is turned. The phase difference between the optical pulses generated by the two rows of slits indicates the direction of rotation. An electronic circuit detects and analyzes the dual pulse stream thus generated and converts this information into digital signals. The digital signals may be presented at a single output having multiple discrete voltage levels representing multiple rates of wheel rotation in each of the two directions, and one voltage level indicating that no rotation is occurring. In some conventional rotary pulse generators, the digital signals are presented at binary outputs.

The digital signals generated by digital encoders typically are provided to a controller such as a microprocessor, a general purpose computer, or the like. The controller converts the digital signals into appropriate control signals for changing the value associated with the user input. For example, in the conventional magnification adjustment wheel introduced above, a slow rate of rotation of the wheel in one direction may cause the controller to slowly increment the associated magnification value by increasing that value's least significant digit. A more rapid rotation in the same direction may cause the controller to more rapidly increase the magnification value by increasing the next-most significant digit, and so on. Rotations in the opposite direction result in analogous decrements to the appropriate digits of the controlled value. Other types of known digital encoding devices produce digital signals that are responsive to the degree, rather than the rate, of motion. For example, a user may rotate a knob mechanically coupled to a rheostat, thereby producing an analog voltage that varies in proportion to the extent to which the knob is rotated. Any of a variety of known circuits including analog-to-digital converters may then be used to convert the analog voltage to digital signals. The digital signals are processed by a controller in an appropriate manner.

These and other conventional digital encoders, however, suffer from one or more of the following disadvantages. Many conventional digital encoders include numerous components. For example, the rotary pulse generator includes light emitting and sensing components and associated detection conversion circuitry. Such components add cost and complexity to the host instrumentation or other device in which the displacement encoder is implemented. Other known digital encoders require less costly or less complex components to generate analog signals, such as the above-noted rheostat. However, these digital encoders require an additional analog-to-digital conversion component that again adds cost and complexity. Moreover, in some applications, the requisite number of components necessary to implement such known digital encoders has been found to be incompatible with the limited space or dimensional requirements of the host device. Furthermore, the additional complexity may also adversely affect reliability and accuracy.

What is needed, therefore, is a system and method that provides an inexpensive, simple and reliable technique for digitally representing a position of a user-controlled mechanical actuator.

SUMMARY OF THE INVENTION

The present invention is a digital displacement encoder and associated methodology that overcomes the above and other drawbacks of conventional systems which digitally encode a user-supplied displacement. In one aspect of the invention, a digital displacement encoder is disclosed. The digital displacement encoder includes a mechanical actuator constructed and arranged to be displaced to one of a null and a plurality of activation positions in response to an externally-provided force. Also included is a conductive member constructed and arranged to be positioned to one of a plurality of intermediate positions in response to the change in position of the mechanical actuator. A contact array comprising a plurality of activation signal contacts is fixedly disposed proximate to the conductive member. Also included is a digital signal generator comprising one or more electrical circuits electrically coupled to the plurality of activation signal contacts, and one more terminals at which output signals are provided. The conductive member electrically contacts a predetermined one or more of the plurality of activation signal contacts when the mechanical actuator is in each of the plurality of positions. At each of the intermediate positions, the conducive member electrically alters the electrical circuits that include the contacted signal contacts to cause a change in output signals.

Preferably, the conductive member is comprised of a conductive elastomeric material. Also, it is preferable that a biasing element be included to urge the conductive member toward its null position. In one embodiment, the digital signal generator is a voltage pull-up circuit, although any type of circuit may be used. In one embodiment, the digital signal generator provides a plurality of output signals having a nominal state responsive to the mechanical actuator being in the null position, and a plurality of activation states each responsive to the mechanical actuator being in one of the plurality of activation positions. In certain embodiments, the conductive member is electrically connected to an activation reference voltage corresponding to an activation state of the output signals. The activation reference voltage may be at ground potential or at some supply voltage. Preferably, the signal contacts are traces on the printed circuit board. The mechanical actuator may be a rocker button, wheel or slide, among others.

In another aspect of the invention a digital displacement encoder is disclosed. The digital displacement encoder includes a signal generator circuit comprising a plurality of output terminals and a plurality of activation signal contacts each fixedly connected to a base and electrically connected to at least one of the output terminals. A mechanical actuator movably disposed with respect to the base so that it may be positioned at any of a plurality of positions in response to a user-supplied displacement. The actuator comprises a conductive member configured to be located at a null position and a plurality of activation positions, the conductive member disposed away from each of the plurality of activation signal contacts while in the null position and contacting one or more of the activation signal contacts while in each of the plurality of activation positions. The conductive member causes the signal generator circuit to generate one or more digital output signals at the output terminal(s), each the plurality of digital output signals having a first state associated with the null position and a second state associated with the activation position. In one embodiment, the digital signal generator is a voltage pull-up circuit, although any circuit now or later developed may be used. The base is preferably a printed circuit board and the signal contacts comprise traces on the printed circuit board. A biasing element is preferably included in certain embodiments to urge the conductive member toward its the null position.

In another aspect of the present invention a method for digitally encoding a plurality of user-supplied displacements of a mechanical actuator is disclosed. The method includes the steps of a) positioning a mechanical actuator to a selected one of a plurality of positions; b) electrically altering a signal encoder circuit associated with the selected position of the mechanical actuator, the signal encoder circuit including one of a plurality of signal contacts of a signal contact array; and c) generating, by the altered circuit, one or more output signals identifying the selected position of the mechanical actuator. In one embodiment, step b) comprises the step of 1) positioning a conductive member operationally coupled to the mechanical actuator to one of a plurality of intermediate positions associated with the selected position of the mechanical actuator, the conductive member contacting one or more of the signal contacts when in the intermediate position, thereby electrically altering the signal encoder circuit.

Advantageously, the digital signal encoder may be configured with any number of signal states and output termi-nals to achieve a desired degree of refinement to reflect the position of the mechanical actuator. Another advantage of the present invention is that it directly converts a continuous user-supplied displacement into a digital electrical signal. This capability for direct encoding is in contrast to some known systems and methods that convert continuous mechanical action into analog electrical signals, and then convert the analog electrical signals into digital electrical signals. By eliminating the need for analog-to-digital conversion, the present invention generally reduces cost and simplifies operation in comparison to such known systems and methods.

The present invention also provides significant commercial advantages over other types of known systems that provide direct digital encoding of user-supplied mechanical action. In particular, the digital displacement encoder of the present invention is generally less expensive and less complex than such known direct encoding systems and methods, and may also be more reliable and more compact. In addition, the present invention typically provides the user with superior tactile feedback as compared to known direct or indirect digital encoding systems and methods.

A still further advantage of the present invention is the use of a conductive elastomeric material, which is compliant and conductive. Such a conductive elastomeric material provides a secure electrical connection with each of the signal contacts as it comes into contact as a result of the intermediate displacement, irrespective of irregularities that may occur in the surface of signal contacts or of other factors.

BRIEF DESCRIPTION OF THE DRAWINGS

The above and further advantages of the invention will be more clearly appreciated from the following detailed description when taken in conjunction with the accompanying drawings, in which like reference numerals indicate like structures or method steps, in which the left-most one or two numerals of a reference numeral indicate the number of the figure in which the referenced element first appears, and in which.

DETAILED DESCRIPTION

Figure 1A:
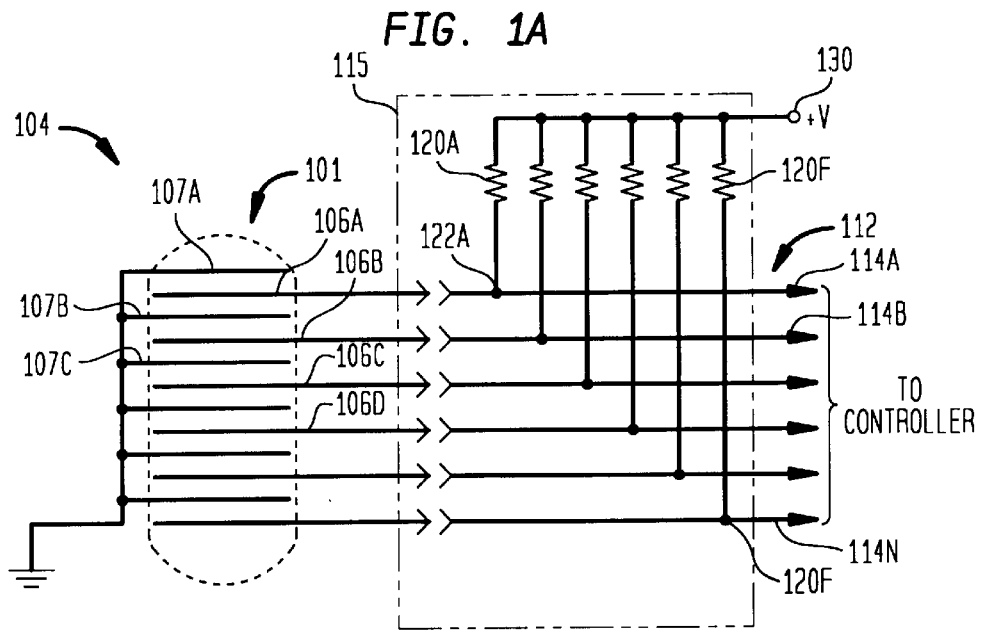
FIG. 1A is a schematic diagram of a signal encoder in accordance with one embodiment of the present invention which includes an electrical contact array.
Figure 1B:
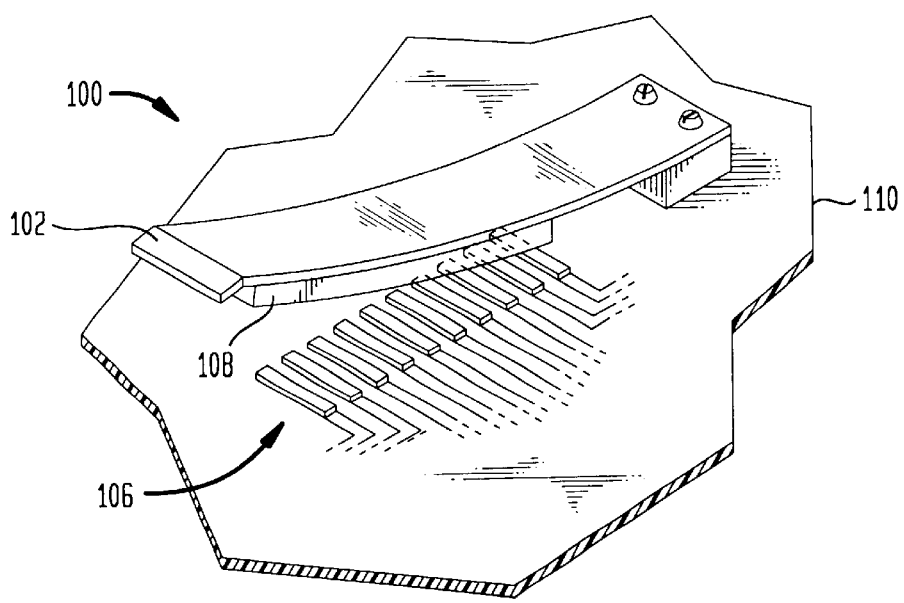
FIG. 1B is a perspective view of one embodiment of a mechanical actuator positioned relative to the array of conductive elements or contacts illustrated in FIG. 1A.
Figure 1C:
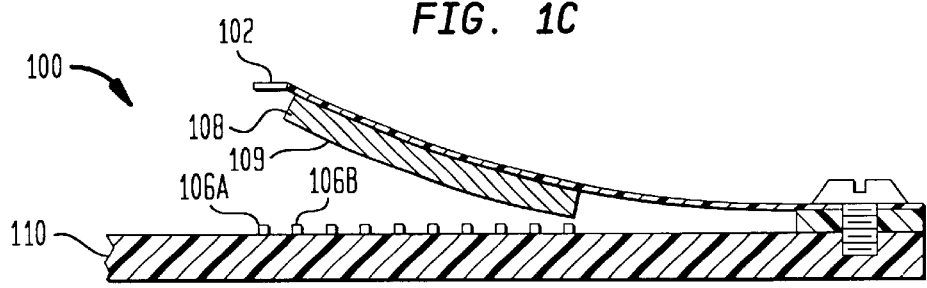
FIG. 1C is a cross-sectional view of the mechanical actuator and contact array illustrated in FIG. 1B.

The present invention is an apparatus and method for digitally encoding a position of a mechanical actuator, the displacement of which is determined by an externally-generated force. FIGS. 1A–1C illustrate one embodiment of the digital displacement encoder of the present invention. FIG. 1A is a schematic diagram of one embodiment of a signal encoder 104 which includes an electrical contact array 101 having a plurality of conductive elements or contacts 106N and/or 107N. FIG. 1B is a perspective view of one embodiment of a mechanical actuator 102 positioned relative to the array 106 of conductive elements or contacts. FIG. 1C is a cross-sectional view of the mechanical actuator 102 and contact array 106 illustrated in FIG. 1B illustrating the mounting of the contact array 106 on a [printed circuit] board 110 (for example a circuit board, referred to herein as printed circuit board 110).

The digital displacement encoder 100 digitally encodes a current position of the mechanical actuator 102, which may be displaced to any one of a null position or a plurality of predetermined activation positions. Connected to or integral with the mechanical actuator 102 is a conductive member 108. At each activation position of the mechanical actuator 102, the conductive member 108 electrically contacts certain conductive elements 106. Such contact causes the conductive member 108 to electrically modify or alter an electrical circuit that is electrically connected to the conductive elements 106 which have been contacted. The electrical altering of each circuit causes a change in a number and/or values of signals provided at terminals 114 of digital interface 112. Thus, the signal encoder 104 generates digital signals representing a current position of the mechanical actuator 102 and, hence, generates a digitally encoded value for a user-supplied displacement of the mechanical actuator 102.

Preferably, the digital displacement encoder 100 directly converts a user-supplied displacement of a mechanical actuator into a digital signal output. This capability for direct encoding provides advantages over some conventional techniques that convert analog mechanical action into analog electrical signals, and then convert the analog electrical signals into digital electrical signals. By eliminating the analog-t-o-digital conversion, the present invention generally reduces cost and simplifies operation in comparison to such known techniques. The present invention is also generally less expensive and less complex than many known encoding techniques, and may also be more reliable and more compact, providing significant commercial advantages over traditional approaches. In addition, the present invention typically provides the user with superior tactile feedback as compared to many conventional techniques. Such advantages will become more evident in relation to the various embodiments of the present invention, as described below.

Referring to FIGS. 1A-1C, the illustrative embodiment of the digital displacement encoder 100 of the present invention will be described in detail below. As noted, the digital displacement encoder 100 digitally encodes a user-supplied displacement provided to the mechanical actuator 102. The mechanical actuator 102 is displaced from a null position to one of a plurality of activation positions in response to a user applying a force so that the conductive element 108 contacts one or more signal contacts 106. As used hereinafter, the term "mechanical actuator" will be understood, unless the context otherwise requires, to refer to a knob, wheel, button, slide, lever, or any other mechanical device or interface upon which a user may impose a displacement. Certain exemplary embodiments of the mechanical actuator are described in detail below.

In the illustrative embodiment, the conductive member 108 is fixedly attached to the mechanical actuator 102 and is movably disposed with respect to the contact array 106. The conductive member 108 moves between a null position and a plurality of activation positions. In the exemplary embodiment illustrated in FIGS. 1A–1C, when in the null position the conductive member 108 is not in contact with the activation signal contacts; in each of the activation positions, the conductive member 108 contacts one or more of the plurality of signal contacts 106. These plurality of activation positions of the conductive element 108 are responsive to the plurality of user-supplied displacements of the mechanical actuator 102. Thus, in one embodiment, the user initiates a displacement by moving the mechanical actuator 102 which causes an intermediate displacement of the conductive member 108, moving it from a null position to one of the activation positions. It should be understood that the null and activation positions may be any known positions, and may generate any output signals and signal values at interface 112.

In the illustrative embodiment, the mechanical actuator 102 is typically self-biasing. That is, it includes in its construction spring steel or a similar material to provide flexibility and resiliency so that it returns to its null position when the user releases the mechanical actuator. It should be understood to those skilled in the relevant art that alternative biasing schemes are possible. For example, a spring may be provided between base 110 and mechanical actuator 102 so that a force exerted by the spring opposes the force exerted by the user on the mechanical actuator 102. The conductive member 108 will return to a null position when the force exerted by the user is removed. In other embodiments, no biasing element or force is be provided. Rather, the user displaces the mechanical actuator 102 to cause the conductive member to travel from a null position to an activation position, and the conductive member remains in such position until the user displaces the mechanical actuator either toward another activation position or toward the null position.

The term "conductive member" will be understood herein to refer to a member that is capable of conducting electricity at least between the points on such member at which it contacts one or more of the plurality of signal contacts 106.

It will be understood to those skilled in the art that conductive member 108 may be configured in a variety of ways to achieve this conductive characteristic. For example, conductive member 108 may be made entirely of a conducting material so that when its bottom surface 109 is in contact with two or more signal contacts 106, such as signal contacts 106A and 106B, electricity may be conducted between those signal contacts through the conductive member 108. Alternatively, conductive member 108 may be made of a non-conductive material except for the portion which is to contact the contact array 106. Here, bottom surface 109 which, the illustrated embodiment, has a layer or coating of conductive material. In one embodiment, the bottom surface 109 of conductive member 108 is made of any one of a variety of known conductive elastomeric materials. In one particular embodiment, the conductive member 108 comprises silicon rubber embedded with graphite. The advantageous properties of such a material are that it is compliant as well as conductive, enabling the bottom surface 109 to provide a reliable and continuous electrical connection with each of the signal contacts 106 in which bottom surface 109 comes into contact as a result of an intermediate displacement.

In the illustrative embodiment, signal contact array 101, in addition to the contact array 106, includes generally evenly spaced ground signal contacts 107A–N, each arrayed generally transverse to the longitudinal axis of bottom surface 109. Generally evenly spaced and interleaved between each of the ground signal contacts 107 are the signal contacts 106, all of which are electrically connected to a digital signal generator 115. In the present embodiment, ground signal contacts 107 and signal contacts 106 are typically traces on printed circuit board 110. As bottom surface 109 progressively contacts ground signal contact 107 and signal contact 106, an electrical connection is established between such contacts, which hereafter will generally be referred to as a signal contact pair.

As noted, the signal encoder 104 includes the plurality of activation signal contacts 106, each electrically coupled to the at least one output terminal. Digital output signals are generated one or more output terminals 114. In accordance with one embodiment of the signal encoder 104, the digital output signals are in a nominal state when conductive member 108 is at its null position and are in an activation state when conductive member 108 is in one of its activation positions. It is not material to the present invention which one of many known electrical circuits, including, for example, voltage dividers, multi-stage electrical switches, and other circuits are used to generate signals in response to the electrical altering of circuit paths. For ease of description, the term "digital signal generator" 115 will be used and be understood to include any such known electrical circuit, or circuit serving a similar function developed now or in the future.

One such known circuit is provided as an illustrative example in FIG. 1A. Each signal contact 106A–N is connected to a corresponding output terminal 114A–N. Each of the signal contacts 106 is also connected to a pull-up resistor R120 at a node 122. The voltage 130 typically is a supply voltage of, for example, 5.0 volts. As conductive member 108 comes into simultaneous contact with signal contact 107A, which is connected to ground, and signal contact 106A, which is connected to node 122A, the voltage at the terminal 114A changes from the positive voltage to ground potential. Thus, output terminal 114A changes from its nominal state of, for example, 5.0 volts, to its activation state of 0 volts.

As the user-supplied displacement increases, the intermediate displacement of conductive member 108 increases until conductive member 108 comes into contact with contact pairs 106B, 107B; 106C, 107C; and so on. Consequently, terminals 114B, 114C, etc., are similarly altered. Thus, as will be evident from FIG. 1A and the preceding description, progressive changes in the displacement of the mechanical actuator 102 results in progressive electrical contact between bottom surface 109 of conductive member 108 and signals contacts 106. Such contact progressively changes the corresponding outputs of the signal contacts from their nominal states to their activation states.

As will be evident to those skilled in the relevant art, the supply voltages could have values other than those used in this illustrative example and, although the particular voltage levels representing the nominal and activation states of the output terminals may thus change, the encoding of the output terminals at two generally discrete voltage states would occur as described above. Thus, progressive user-supplied displacement applied to mechanical actuator 102 is directly encoded by digital displacement encoder 100 into binary digital signals at output terminals 114. Alternatively, the digital signal generator 115 may be configured to generate a single digital output signal 114 having a plurality of values. In such an embodiment, each signal value is generated in response to the successive contact of conductive member 108 and signal contact pairs 106, 107. Thus, altering one circuit will cause the output signal to have one value; altering 2 circuits, another; and so on. It should also be understood that the signal contact array 101 may be constructed of a single ground signal contact 107. In such an embodiment, the ground signal contacts 107B–107N may be eliminated so that the contact array 106 includes a single ground signal contact 107A and activation signal contacts 106. This would allow additional signal contacts 106 to be added to the array 106, thereby incrementing encoder resolution.

Typically, output terminals 114 of digital displacement encoder 100 will be electrically connected to a microprocessor, a general purpose computer, or similar controller device (hereafter, simply "controller," not shown) for processing such digital information and controlling one or more functions, displays, or other aspects of an instrument or other device (hereafter, simply "instrument," not shown). For example, digital displacement encoder 100 may be connected to the controller of a power supply with an output voltage display meter. As will be evident to those skilled in the art, the digital signals present at output terminals 114 may be processed by the voltage supply's controller for a variety of purposes. In one aspect of the present embodiment, for example, progressive encoding of output terminals 114 from a nominal state to an activation state may be taken to represent the user's desire to increment the output voltage setting. That is, if the user wishes to increment the voltage, the user applies a user-supplied displacement to mechanical actuator 102 sufficient to cause conductive member 108 to come into contact with signal contact 160A and thus cause output terminal 114A to change from its nominal state to its activation state. Acting upon this change in the digital output of output terminals 114, the controller causes the output voltage setting to be incremented, and such incrementation may typically continue until the user reverses the user-supplied displacement by relaxing the force exerted on the mechanical actuator 102. If, however, the user wishes to cause the setting to increment at a faster rate, the user may increase the user-supplied displacement so that conductive member 108 comes into contact with both signal contact pairs 106A, 107A and 106B, 107B, thus causing output terminals 114A and 114B to assume their activation states. If a user activates mechanical activator 102 resulting in a small displacement, the voltage increments would correspond to the least significant digits of the output voltage display meter. If the user-supplied displacement is greater, the voltage increments increasingly correspond to more significant digits of the output voltage display meter. Thus, there is a direct relationship between the user-supplied displacement, output voltage adjustment displacement and output voltage display meter digit resolution.

Advantageously, digital displacement encoder 100 provides direct and intuitive tactile feedback to the user regarding the encoding process. The user may feel both the amount of displacement and, in this embodiment, the amount of force, required to achieve such displacement. With the controller configured to utilize digital displacement encoder 100 as a variable rate encoder the user may, for example, sense the rate of incrementation of a voltage meter setting by the amount of displacement applied to mechanical actuator 102 or the amount of biasing force exerted by conductive member 108 and thence through mechanical actuator 102 to the user. Such intuitive tactile feedback is lacking in some known systems and methods, such as a rotary pulse generator, since it typically may be more difficult to sense derivative changes, such as the change in rate of turning a wheel, than a direct change such as change of displacement or, optionally, of force required to achieve a displacement.

Figure 2A:
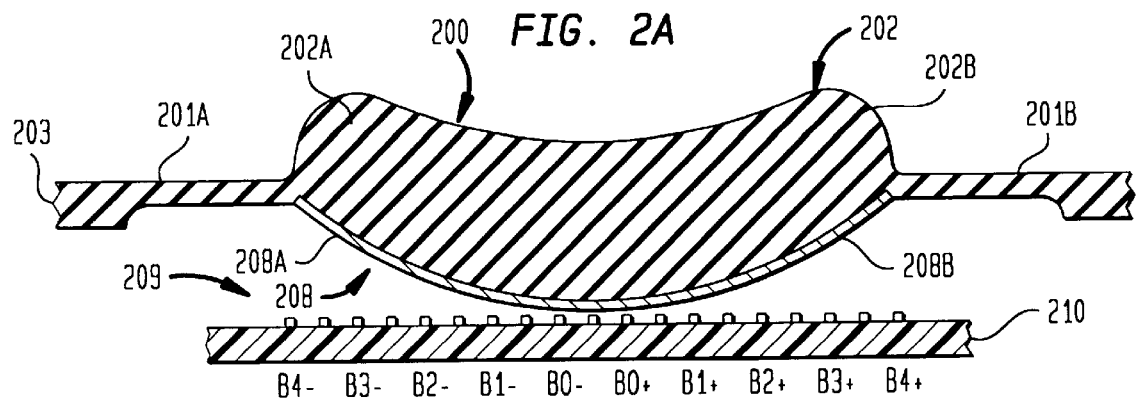
FIG. 2A is a cross-sectional side view of an embodiment of a signal contact array and mechanical actuator of one embodiment of the invention.
Figure 2B:
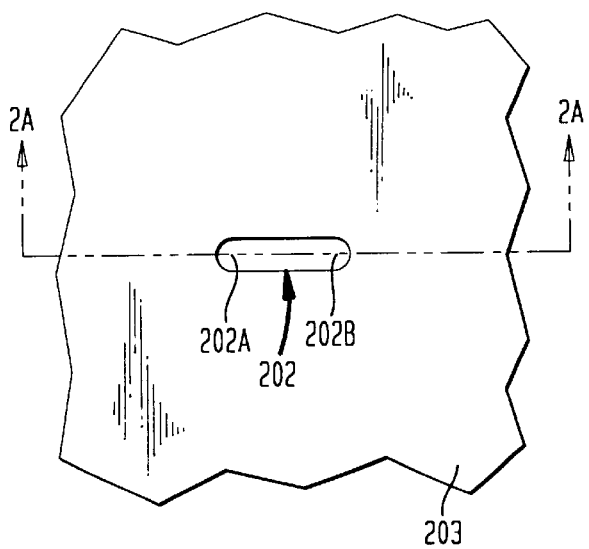
FIG. 2B is a top view of the embodiment illustrated in FIG. 2A.
Figure 2C:
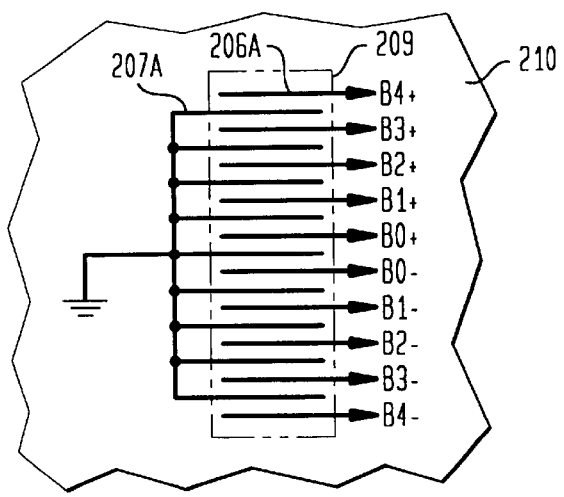
FIG. 2C is a top plan view of the signal contact array of this embodiment.

Yet another embodiment of the present invention is illustrated in FIGS. 2A–2C. FIG. 2A is a cross-sectional side view of an embodiment of a signal contact array and mechanical actuator of this embodiment of the invention. FIG. 2B is a top view of the embodiment illustrated in FIG. 2A. FIG. 2C is a top plan view of the signal contact array of this embodiment. The invention according to these figures will be referred to as digital displacement encoder 200.

Mechanical actuator 202 is a molded rocker button preferably made of an elastomeric material. Rocker button 202 is hinged on each of its two longitudinal sides 202A and 202B. The respective hinge mechanisms are labeled 201A and 201B. It should be understood that any known hinge mechanism may be employed. Hinge mechanisms 201A and 201B secure rocker button 202 to a housing 203. Housing 203 typically is the housing for the instrument with respect to which digital displacement encoder 200 provides digital encoding of the user-supplied displacement of rocker button 202. However, digital displacement encoder 200 may be housed in a separate housing. Conductive member 208 generally extends over the entire bottom surface of rocker button 202 and is made of any electrically conductive material. In one embodiment, the conductive member 208 is made of a conductive elastomeric material. However, in this embodiment, the conductive member 208 does not change its shape as did the conductive member 108. Accordingly, the conductive member 208 may be made of a conductive material having less elasticity than that of conductive member 108. The portion of conductive member 208 on side A, that is, proximate to hinge mechanism 201A, is labeled 208A, and that portion on side B is labeled 208B.

A user-supplied displacement is created when the user asserts a force directed toward base 210 on either portion 202A or 202B of rocker button 202. Base 210 in the illustrated embodiment is a printed circuit board. When a user-supplied displacement is imposed on portion 202A of the rocker button, portion 208A of the conductive member 208 incurs a intermediary displacement. As the user-supplied displacement, and thus the intermediate displacement, are progressively increased, conductive member 208A progressively contacts signal-contact pairs on that portion of signal contact array 209 that is proximate to hinge mechanism 201A. The first such pair to be so contacted is made up of ground signal contact 207A and signal contact 206A. In the present embodiment, signal contact array 209 is constructed of printed circuit board traces. Depending on the curvature of conductive member 208 any number of contact pairs in the array 209 may be simultaneously altered by the conductive member 208.

As shown in FIG. 2C, the above-described signal contacts of signal contact array 209 are generally evenly spaced and are arrayed generally transverse to the longitudinal axis of conductive member 208. However, certain central signal contacts such as a ground signal contact 207 may be constructed so as to be substantially wider than the other signal contacts so that a null-zone is created. The null zone provides that no circuit will be electrically altered by conductive member 208 with a signal contact 206 until a user-supplied displacement above a predetermined threshold, proportional to the width of the null zone, has been made. In an alternative embodiment, the null zone may be an area on printed circuit board 210 on which no signal contacts are traced. Such a null zone in either embodiment advantageously prevents spurious encoding as the user rests his or her finger on rocker button 202. Ground signal contacts 207 and signal contacts 206 typically are electrically connected in a known manner to a digital signal generator (not shown) such as, for example, the digital signal generators described above.

Digital displacement encoder 200 advantageously allows a user selectively to increment or to decrement, either at a fixed or variable rate, by imposing a displacement selectively on portion 202A or portion 202B of the rocker button 202. Such selective user-supplied displacements may be effectuated in any of a variety of known methods by the controller (not shown). For example, the controller may be configured to interpret changes in the binary output signals of the output terminals connected to end contacts (B4+) of signal contact array 209 as indicating an intention of the user to increment a setting, and thus such setting would be incremented. Similarly, a change from nominal to activation state of an output terminal connected to B4– of signal contact array 209 may result in a decrement of the setting. Advantageously, the selective user-supplied displacement in either of two general opposing directions is intuitively related to selective incrementing or decrementing of a setting, which are generally opposing operations. Thus, the advantageous tactile feedback of the present invention is further enhanced in the present embodiment. Other advantages ascribed to the previously described embodiments of the present invention also apply to digital displacement encoder 200.

Figure 3A:
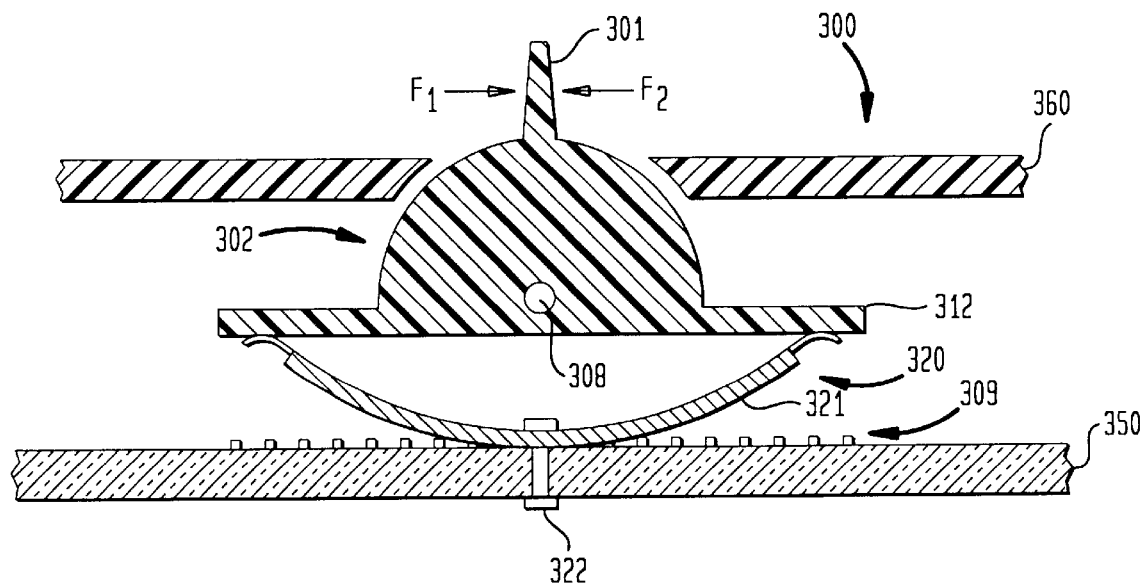
FIG. 3A is a cross-sectional side view of a mechanical actuator and contact array of an alternative embodiment of the digital displacement encoder of the present invention implemented having a rocker action.
Figure 3B:
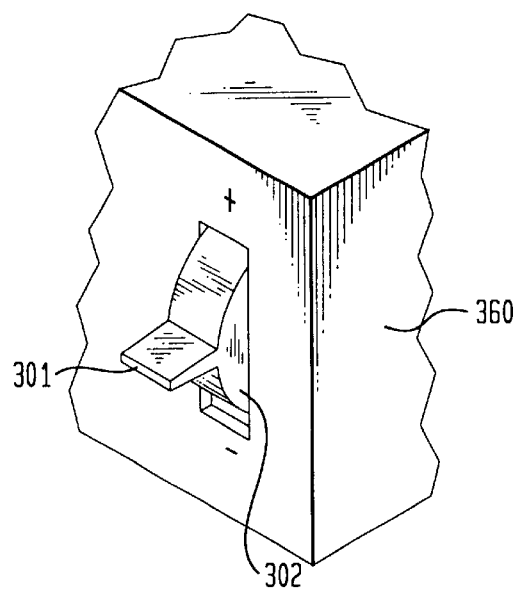
FIG. 3B is a partial perspective view of the mechanical actuator shown in FIG. 3A protruding from a housing.

FIGS. 3A and 3B illustrate another alternative embodiment of the digital displacement encoder of the present invention. FIG. 3A is a cross-sectional side view of a mechanical actuator 302 and contact array 309 of a digital displacement encoder 300. FIG. 3B is a partial perspective view of the mechanical actuator 302 shown in FIG. 3A protruding from a housing 360. In this embodiment, the mechanical actuator 302 is a pivoted switch having an integral extension arm 301 serving as a lever by which a user can rotate the mechanical actuator about a pivot axis 308. On a side of the mechanical actuator 302 other than that which includes the lever 301, is an extension arm 312 radially extending a predetermined distance from the pivot axis 308. The extension arms are configured to interoperate with a conductive member 320 which, in this embodiment, is not fixed to the mechanic actuator 302. Application of a force to either side of the lever 301 causes the mechanical actuator to rotate about pivot axis 308. This causes the extension arms 312 to also rotate about the pivot axis 308. Such rotation causes the conductive member 320 to assume a predetermined intermediate position associated with the position of the level 301. In the embodiment illustrated in FIG. 3A, conductive member 320 is generally concave with respect to the extension arm 312, and typically is constructed of a self-biasing material such as spring steel. The conductive member 320 has a bottom surface 321, preferably comprised of a conductive elastomeric material. In this embodiment, the conductive member 320 is secured at a substantially central point generally below pivot pin 308 to base 350 by a fastener 322. In one embodiment, the fastener 322 is a rivet. In this configuration, a portion of the conductive member 320 extends from the secured point 322 and rises above the contact array 309.

A user-supplied displacement is created when a user asserts a force $F_1$ or $F_2$ on the lever 301. This causes the mechanical actuator 302 to rotate about the pivot pin 308, thereby causing one portion of the extension arm 312 to exert a downward force on the conductive member. This causes that portion of the conduct member 320 to incur an intermediate displacement associated with the user-supplied force and subsequent displacement of lever 301. As the user-supplied displacement, and thus the intermediate displacement of the conductive member 320, are progressively increased, the conductive surface 321 progressively contacts additional signal contacts of the array 309. As in the above embodiments, the signal contact array 309 is preferably comprised of printed circuit board traces.

In alternative embodiments, the signal contact array 309 may be constructed of signal contact pairs such as those described above with reference to the displacement encoders 200 or 300. In the present embodiment, however, the ground signal contacts may be advantageously eliminated so that the contact array 309 includes activation signal contacts only. In such an embodiment, the ground contact can be supplied through the central secured point, such as rivet 322, or in a first contacted ground trace as described above with reference to FIG. 1.

The signal contact array 309 and bottom surface 321 of conductive member 320 typically are electrically connected in a known manner to a digital signal generator such as, for example, the generators described above. The output terminal(s) of digital displacement encoder 300 (not shown) are electrically connected to the activation signal contacts of signal contact array 309 and are encoded by the digital signal generator, for example, as described above.

As was described, for example, with respect to digital displacement encoder 200, digital displacement encoder 300 advantageously allows a user selectively to increment or to decrement, either at a fixed or variable rate, by imposing a displacement selectively on lever 301 in direction A or direction B. Other advantages ascribed to the previously described embodiments of the present invention also apply to digital displacement encoder 300.

Figure 4A:
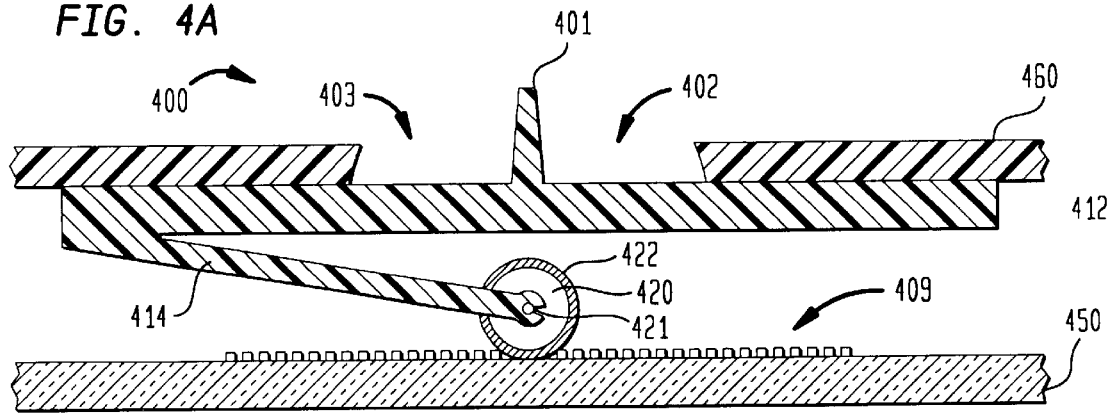
FIG. 4A is a cross-sectional side view of a mechanical actuator and contact array of yet another embodiment of the digital displacement encoder of the present invention implemented having a slider action.
Figure 4B:
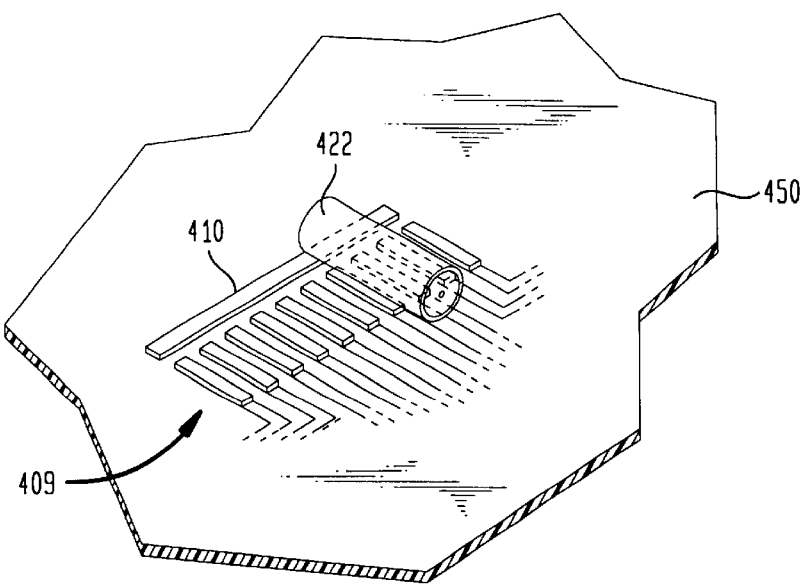
FIG. 4B is a perspective view of one embodiment of the array of conductive elements or contacts illustrated in FIG. 4A.
Figure 4C:
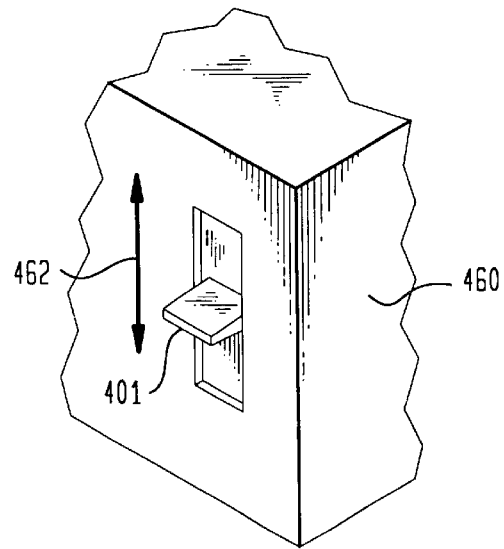
FIG. 4C is a partial perspective view of the mechanical actuator shown in FIG. 4A protruding from a housing.

Yet another embodiment, referred to as digital displacement encoder 400, is represented in FIGS. 4A through 4C. FIG. 4A is a cross-sectional side view of a mechanical actuator 402 and contact array 409 of the digital displacement encoder 400. FIG. 4B is a perspective view of one embodiment of the array 409 with a ground trace 410 running adjacent to the contacts. FIG. 4C is a partial perspective view of the mechanical actuator 402 protruding from a housing 460. In this embodiment of the present invention, mechanical actuator 402 is a slide switch. A slide arm 412 has an integral extension 401 which protrudes through an opening 403 in the housing 460. The lever 401 can be manipulated by a user by sliding it in the direction of arrows 462 until the lever 401 reaches the end of its travel in opening 403. The slide arm 412 is positioned above the contact array 409 on base 450. An extension arm 414 extends from the slide arm 412 toward the contact array 409. At the distal end of the extension arm 414 is a conductive member 420 in the form of a wheel. The substantially circular conductive member 420 rotates about an axis 421 on the end of the extension arm 414. On the circumference of the conductive member 420 is a surface 422 made of a conductive material. As shown in FIGS. 4A and 4B, as the lever 401 travels in either direction 462 in the opening 403 of the housing 460, the conductive member 420 rotates, traveling over the contacts in the contact array 409. At any given position of lever 401, the conductive member 420 assumes an associated intermediate position over a predetermined two or more contacts in the contact array 409. In the embodiment illustrated in FIG. 4B, wheel 422 is a cylinder that simultaneously contacts an element and a ground trace 410 adjacent to the elements in the array 409. The ground trace 410 runs along the path of wheel 422 to insure continual contact with wheel 422. This enables the contact elements to be signal contacts only, increasing the resolution of the encoder 400. Mechanical actuator 402 may be constructed of a variety of generally rigid, but optionally also somewhat flexible, materials, such as molded plastic.

Lever 401 may be displaced by the user, causing conductive member 420 to roll and to progressively contact the ground signal activation signal contacts of contact signal array 409. Signal contact array 409 typically is constructed of printed circuit board traces. In one embodiment, contacts of signal contact array 409 are arranged in the manner described above. In one embodiment, the spacing between the signal contact pairs may be arranged, in view of the radius and elasticity of conductive member 420, and other factors, so that conductive member 420 makes an electrical connection between not less than one set of signal contact pairs at any intermediate displacement. In the version illustrated in FIG. 4B, one of the signal contacts is ground trace 410.

Ground signal and activation signal contacts are electrically connected in a known manner to a digital signal generator such as, for example, the generators described above. The output terminals of digital displacement encoder 400 (not shown) are electrically connected to the activation signal contacts of signal contact array 409 and are encoded by the digital signal generator, for example, as described above.

An advantage of the optional arrangement of signal contact array 409 described above is that the digital output signals at output terminals (not shown) electrically connected to each of the activation signal contacts return to their nominal states when successive activation signal contacts are activated. Such advantageous arrangement may also be implemented in other embodiments, such as that of digital displacement encoder 300. To further illustrate the effects of such optional arrangement in reference to the present embodiment, the output terminal connected to one activation signal contact changes from its nominal state to its activation state in response to an initial intermediate displacement in direction A. As such intermediate displacement progresses and another signal contact pair is electrically altered by conducting member 420, the connection between the first pair is broken and the output terminal connected to that signal contact returns to its nominal state. Such encoding of the user-supplied displacement provides a positive indication of such displacement since, typically, not more than one output terminal corresponding to an activation signal contact is in its activation state for any particular user-supplied displacement. In other embodiments, in which the activation state of an activation signal contact is maintained as progressive connection is made to subsequently contacted activation signal contacts, a failure of the last activation signal contact to cause a corresponding change in its output terminal may not be detected as an error condition until an additional user-supplied displacement is provided in the same direction.

As was described, for example, with respect to digital displacement encoder 300, digital displacement encoder 400 advantageously allows a user selectively to increment or to decrement, either at a fixed or variable rate, by imposing a displacement selectively on lever 401. Also advantageously, mechanical actuator 402 may optionally not be biased to return to its null position. Thus, having been displaced by a user-supplied displacement, mechanical actuator 402 remains in such displaced position until another user-supplied displacement is applied to it. A setting on the associated instrument therefore may be incremented or decremented continuously or remain at a set value, without the user being in contact with mechanical actuator 402, until the user returns mechanical actuator 402 to its null position. Other advantages ascribed to the previously described embodiments of the present invention also apply to digital displacement encoder 400.

Having now described various embodiments of the invention, it should be apparent to those skilled in the relevant art that the foregoing are illustrative and not limiting, having been presented by way of example only. For example, it should be understood that in alternative embodiments circuits that generate analog signals may be used. In such embodiments, analog-to-digital converters would likely be implemented as well, eliminating some noted advantages associated with directly converting the displacement to a digital signal. Also, the base 110 may be other materials that support the contact array 106 besides the printed circuit board embodiment described above. Numerous other embodiments and modifications thereof are contemplated as falling within the scope of the present invention as defined by appended claims and equivalents thereto.

What is claimed is:

1. A digital displacement encoder comprising:
   a mechanical actuator constructed and arranged to be displaced, with a single type of motion, to one of a null position or a plurality of activation positions in response to an externally-provided force;
   a conductive member constructed and arranged to be positioned to one of a plurality of intermediate positions in response to said displacement of said mechanical actuator;
   a contact array, comprising a plurality of activation signal contacts arranged in a substantially planar orientation, fixedly disposed proximate to said conductive member; and
   a digital signal generator comprising one or more electrical circuits electrically coupled to said plurality of activation signal contacts, and one more terminals at which output signals are provided by said one or more electrical circuits,
   wherein said conductive member electrically contacts a predetermined one or more of said plurality of activation signal contacts when said mechanical actuator is in each of said plurality of positions to electrically alter those of said one or more electrical circuits which are electrically coupled to said contacted activation signal contacts to cause a change in said output signals.

2. The digital displacement encoder of claim 1, wherein said digital signal generator is a voltage pull-up circuit.

3. The digital displacement encoder of claim 1, wherein said mechanical actuator comprises a rocker button.

4. The digital displacement encoder of claim 1, wherein said mechanical actuator comprises a wheel.

5. The digital displacement encoder of claim 1, wherein said mechanical actuator comprises a slide.

6. The digital displacement encoder of claim 1, wherein said conductive member is comprised of a conductive elastomeric material.

7. The digital displacement encoder of claim 6, wherein said signal contacts comprise traces on a printed circuit board.

8. The digital displacement encoder of claim 1, wherein each of said plurality of output signals has a nominal state responsive to said mechanical actuator being in a null position and having an activation state responsive to said mechanical actuator being in one of a plurality of activation positions.

9. The digital displacement encoder of claim 3, wherein said conductive member is electrically connected to an activation reference voltage corresponding to an activation state of said output signals.

10. The digital displacement encoder of claim 9, wherein said activation reference voltage is ground.

11. The digital displacement encoder of claim 10, further comprising:
  a biasing element configured to urge said mechanical activator toward said null position.

12. A digital displacement encoder comprising:
  a signal generator circuit comprising a plurality of output terminals and a plurality of activation signal contacts arranged in a substantially planar orientation each fixedly connected to a base and electrically connected to at least one of said output terminals; and
  a mechanical actuator movably disposed with respect to said base to be located at one of a plurality of positions in response to a user-supplied motion of a single type displacement of said mechanical actuator, said actuator comprising a conductive member configured to be located at a null position and a plurality of activation positions, said conductive member disposed away from each of said plurality of activation signal contacts while in said null position and contacting one or more of said activation signal contacts while in each of said plurality of activation positions,
  wherein said conductive member causes said signal generator circuit to generate one or more digital output signals at said at least one output terminal, each said plurality of digital output signals having a first state associated with said null position and a second state associated with said activation position.

13. The digital displacement encoder of claim 12, wherein said digital signal generator is a voltage pull-up circuit.

14. The digital displacement encoder of claim 12, wherein the base is a printed circuit board and further wherein said signal contacts comprise traces on said printed circuit board.

15. The digital displacement encoder of claim 12, wherein said mechanical actuator comprises a rocker button.

16. The digital displacement encoder of claim 12, wherein said mechanical actuator comprises a wheel.

17. The digital displacement encoder of claim 12, wherein said conductive member comprises a conductive elastomeric material.

18. The digital displacement encoder of claim 12, further comprising:
  a biasing element configured to urge said mechanical actuator toward said null position.

19. A digital displacement encoder comprising:
  a mechanical actuator;
  a contact array, comprising a plurality of activation signal contacts arranged in a substantially planar orientation;
  a conductive member, in communication with the mechanical actuator, that responsive to said displacement of said mechanical actuator contacts the plurality of activation signal contacts in a predetermined sequence, the progression of the sequence being determined by the direction and displacement of the mechanical actuator; and
  a digital signal generator, electrically coupled to said plurality of activation signal contacts, that outputs a digital signal related to the direction and amount of displacement of the mechanical actuator.

20. A digital displacement encoder comprising:
  a mechanical actuator that moves in an analog manner;
  a contact array, comprising a plurality of activation signal contacts arranged in a substantially planar orientation;
  a conductive member, in communication with the mechanical actuator, that responsive to said displacement of said mechanical actuator contacts the a subset of the plurality of activation signal contacts based the direction and amount of displacement of the mechanical actuator; and
  a digital signal generator, electrically coupled to said plurality of activation signal contacts, that outputs an increasing and decreasing digital signal value related to the direction and amount of displacement of the mechanical actuator.

* * * * *